(12) United States Patent
Nguyen et al.

(10) Patent No.: US 7,700,974 B2
(45) Date of Patent: Apr. 20, 2010

(54) PROCESS FOR FABRICATING ULTRA-LOW CONTACT RESISTANCES IN GAN-BASED DEVICES

(75) Inventors: Nguyen Xuan Nguyen, Granada Hills, CA (US); Paul Hashimoto, Los Angeles, CA (US); Chanh H. Nguyen, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 11/107,485

(22) Filed: Apr. 14, 2005

(65) Prior Publication Data

US 2005/0184309 A1    Aug. 25, 2005

Related U.S. Application Data

(62) Division of application No. 10/600,521, filed on Jun. 19, 2003, now Pat. No. 6,897,137.

(60) Provisional application No. 60/401,415, filed on Aug. 5, 2002.

(51) Int. Cl.
*H01L 29/778* (2006.01)
(52) U.S. Cl. .............................. 257/194; 257/E29.249
(58) Field of Classification Search ................. 257/192, 257/194, E29.246, E29.252, E29.253, E29.249
See application file for complete search history.

(56) References Cited

U.S. PATENT DOCUMENTS

| 5,393,990 | A | * | 2/1995 | Kohn | 257/12 |
|---|---|---|---|---|---|
| 5,696,389 | A | | 12/1997 | Ishikawa et al. | 257/99 |
| 5,739,558 | A | | 4/1998 | Ishida et al. | 257/192 |
| 5,760,418 | A | | 6/1998 | Lee et al. | 257/20 |
| 5,766,695 | A | | 6/1998 | Nguyen et al. | 427/553 |
| 5,866,925 | A | * | 2/1999 | Zolper et al. | 257/279 |
| 5,929,467 | A | * | 7/1999 | Kawai et al. | 257/192 |
| 6,100,548 | A | | 8/2000 | Nguyen et al. | 257/192 |
| 6,100,571 | A | * | 8/2000 | Mizuta et al. | 257/488 |
| 6,104,074 | A | * | 8/2000 | Chen | 257/453 |
| 6,255,673 | B1 | * | 7/2001 | Kuzuhara | 257/192 |

(Continued)

FOREIGN PATENT DOCUMENTS

EP    0 899 782 A2    3/1999

(Continued)

OTHER PUBLICATIONS

Konig et al. Enhancement Mode n-Channel Si/SiGe MODFET with High Intrinsic Transconductance. Electronics Letters, vol. 28, No. 2 (1992).*

*Primary Examiner*—Allan R. Wilson
(74) *Attorney, Agent, or Firm*—Ladas & Parry

(57) ABSTRACT

A process for fabricating ohmic contacts in a field-effect transistor includes the steps of: thinning a semiconductor layer forming recessed portions in the semiconductor layer; depositing ohmic contact over the recessed portions; and heating the deposited ohmic contacts. The field-effect transistor comprises a layered semiconductor structure which includes a first group III nitride compound semiconductor layer doped with a charge carrier, and a second group III nitride compound semiconductor layer positioned below the first layer, to generate an electron gas in the structure. After the heating step the ohmic contacts communicate with the electron gas. As a result, an excellent ohmic contact to the channel of the transistor is obtained.

16 Claims, 4 Drawing Sheets

U.S. PATENT DOCUMENTS

| | | | |
|---|---|---|---|
| 6,316,793 B1 * | 11/2001 | Sheppard et al. | 257/103 |
| 6,391,696 B1 | 5/2002 | Onda | 438/167 |
| 6,492,669 B2 | 12/2002 | Nakayama et al. | 257/282 |
| 6,552,373 B2 * | 4/2003 | Ando et al. | 257/192 |
| 6,787,820 B2 * | 9/2004 | Inoue et al. | 257/192 |
| 6,884,704 B2 | 4/2005 | Hussain et al. | 438/572 |
| 6,897,137 B2 | 5/2005 | Nguyen et al. | 438/602 |
| 2001/0013604 A1 | 8/2001 | Hase | 257/12 |
| 2001/0023964 A1 * | 9/2001 | Wu et al. | 257/368 |
| 2001/0040247 A1 * | 11/2001 | Ando et al. | 257/192 |
| 2003/0218183 A1 * | 11/2003 | Micovic et al. | 257/192 |
| 2004/0021152 A1 | 2/2004 | Nguyen et al. | 257/192 |
| 2004/0029330 A1 | 2/2004 | Nguyen et al. | 438/172 |
| 2005/0048747 A1 | 3/2005 | Hussain et al. | 438/572 |

FOREIGN PATENT DOCUMENTS

| | | |
|---|---|---|
| JP | 2002016087 A | 1/2002 |
| WO | 01/13436 A1 | 2/2001 |
| WO | 01/57929 A1 | 8/2001 |

* cited by examiner

PROCESS FOR FABRICATING ULTRA-LOW CONTACT RESISTANCES IN GAN-BASED DEVICES

CROSS REFERENCE TO RELATED APPLICATIONS

This patent application is a divisional application of U.S. application Ser. No. 10/600,521, filed on Jun. 19, 2003, now U.S. Pat. No. 6,897,137 which application claims the benefit of U.S. Provisional Application No. 60/401,415, filed on Aug. 5, 2002, which is incorporated herein by reference in its entirety.

BACKGROUND OF THE INVENTION

1. Field of the Invention

The present invention relates generally to fabrication processes for transistors. More particularly, it relates to a process for fabricating ultra-low contact resistances in GaN (Gallium Nitride)-based heterojunction field-effect transistors (HFETs).

2. Description of the Related Art

Recent rapid progress in GaN HFET technology provides convincing evidence that this technology will ultimately have a big impact on a wide range of systems, including future generation radar and satellite communications systems. See, for example, U.S. Pat. No. 6,100,548 relating to modulation-doped field-effect transistors and fabrication processes and U.S. Pat. No. 5,766,695 relating to a method for reducing surface layer defects in semiconductor materials having a volatile species.

FIG. 1 shows a cross section of a conventional GaN-based HFET structure, indicated with 1. This structure includes a first semiconductor layer 2 which has a first band gap and is doped with a charge carrier (e.g., an N-type dopant in the form of silicon). Usually this layer 2 is $Al_{0.15}Ga_{0.85}N$ and is approximately 200 angstroms thick. This layer is a donor layer and is doped to have an electron density in the range of $1$-$2 \times 10^{18}$ $cm^{-3}$. The structure 1 also includes an undoped second semiconductor layer 3 positioned below the first semiconductor layer 2. The second semiconductor layer 3 has a second band gap that is less than the first band gap. This second layer is undoped GaN with a thickness of about 2 micrometers and generates a two-dimensional electron gas 4 in the semiconductor structure 1. A third semiconductor layer 5 is positioned between the first and second semiconductor layers 2 and 3. This "spacer" layer 5 is undoped. Although it decreases the carrier density in the two-dimensional electron gas 4, it further enhances the carrier mobility. The spacer layer 5 is $Al_{0.15}Ga_{0.85}N$ and is about 30 angstroms thick.

A source ohmic contact 6 and a drain ohmic contact 7 are formed on top of the structure 1. The ohmic contacts 6, 7 are generally fabricated by evaporating a metal system of titanium, aluminum, nickel and gold (Ti/Al/Ni/Au) onto the layered semiconductor structure 1. The preferred ratios for those elements are Ti=6%, Al=65%, Ni=13%, and Au=16%. This metal system is then alloyed at an elevated temperature (e.g., 900° C.) so that it penetrates the layered semiconductor structure 1 (as indicated by broken lines 8) and communicates with the two-dimensional electron gas 4.

The breakdown voltage (from drain to source) of the HFET structure would be degraded if the ohmic contacts 6, 7 directly contacted the highly doped first semiconductor layer 2. Accordingly, a cap layer 9 is usually carried over the first semiconductor layer 2 and the ohmic metal system of these contacts is evaporated on this cap layer. The cap layer is $Al_{0.15}Ga_{0.85}N$ and has usually the lightest doping that can be fabricated. This doping level is typically referred to as an unintentional doping (UID) level because some doping will inevitably be present.

An e-beam resist 10 is also formed over the layered semiconductor structure 1. A gate pattern is written into the resist 10 with an e-beam and, subsequently, a metallic gate 11 is evaporated into the gate pattern. The first and second semiconductor layers 2 and 3, the spacer layer 5, the ohmic contacts 6 and 7 and the cap layer 9 are carried on an insulating substrate 12, for example sapphire with a thickness of about 250 micrometers.

The fabrication process of GaN devices is a fundamental step for the viability of GaN device technology. In particular, the ability to make low and reproducible ohmic contacts to the channel of the GaN device is of utmost importance. Low ohmic contact resistance is crucial for high-performance devices. Lower contact resistance results in higher speed and gain for the device. Resistive heating is also reduced, therefore increasing reliability and efficiency. High efficiency is a key requirement for power devices. Reproducibility of the contact resistances is also a critical requirement for manufacturability, particularly for MMIC (monolithic microwave integrated circuit) fabrication.

In the GaN HFET structure above described, the ohmic contacts 6, 7 are created by depositing a metalization stack on the surface of the semiconductor, and by subsequently applying an annealing process to alloy the metal with the semiconductor. This approach works very well for GaAs and InP-based materials and devices. However, for GaN-based materials, this approach yields high contact resistances because the presence of the wide band-gap barrier layer, AlGaN, inhibits the ohmic metals from diffusing into the channel and forming proper contacts. Conventional alloy contacts in GaN-based HFET devices usually result in a contact resistance of 2.0 Ω/mm. This contact resistance is ten times the value of contact resistances of GaAs-based devices.

SUMMARY OF THE INVENTION

The present invention solves the aforementioned problem, by providing a fabrication method that reduces the contact resistance by an order of magnitude (ten times) in GaN HFET devices. In this way, the microwave power and low noise performance of GaN devices are greatly improved.

According to a first aspect, the present invention provides a process for fabricating ohmic contacts in a field-effect transistor, the transistor comprising a layered semiconductor structure which includes: a) a group III nitride compound first semiconductor layer having a first band gap and doped with a charge carrier; and b) a group III nitride compound second semiconductor layer having a second band gap that is less than said first band gap and positioned below said first semiconductor layer to generate an electron gas in said semiconductor structure, the process including the steps of: i) thinning the first semiconductor layer, forming recessed portions in said first semiconductor layer; ii) depositing ohmic contacts over said recessed portions; and iii) heating said deposited ohmic contacts, whereby, after the heating step, said ohmic contacts communicate with said electron gas.

According to a second aspect, the present invention provides an improvement in a layered semiconductor structure, the structure including a) a group III nitride compound first semiconductor layer having a first band gap and doped with a charge carrier; and b) a group III nitride compound second semiconductor layer having a second band gap that is less than said first band gap and positioned below said first semiconductor layer to generate an electron gas in said semiconductor structure, the improvement comprising said first semiconductor layer having selectively thinned portions.

According to a third aspect, the present invention provides a field-effect transistor comprising: a) a group III nitride compound first semiconductor layer having a first band gap and doped with a charge carrier; b) a group III nitride compound second semiconductor layer having a second band gap that is less than said first band gap and positioned below said first semiconductor layer to generate an electron gas in said semiconductor structure; and c) ohmic contacts to be heated, said ohmic contacts being located over recessed portions of said first semiconductor layer before being heated and communicating with said electron gas after having been heated.

In accordance with the present invention, a thinning down the wide AlGaN band-gap barrier layer before deposition of the ohmic metals is provided. This thinning is preferably accomplished through use of a recess etching technique. According to this technique, part of the AlGaN barrier is removed by etching before deposition of the ohmic metals to form a recessed region. In order to perform etching, a reactive ion etching process is preferably adopted. Rather than using wet chemicals, reactive ion etching works by introducing active species in gaseous form, preferably chlorine (Cl) atoms and ions, in the material to be etched. Such species react with the semiconductor material to form volatile compounds that will subsequently desorb from such material. Further to the etching, the ohmic contacts are deposited over the recessed portion of the AlGaN layer and subsequently alloyed.

As a result, an excellent ohmic contact to the channel of the device is obtained. In particular, the present invention provides as a result a contact resistance as low as 0.2 Ω/mm for GaN-based HFET devices, ten times lower than usual contact resistance for this kind of materials, and of the same order of magnitude of contact resistances of GaAs-based devices.

The present invention can be, in particular, applied to HFETs making part of product lines related to microwave power and low-noise amplifiers, such as active array radars at X-band and power amplifiers for wireless satellite/communications applications.

The present invention will be best understood from the following description when read in conjunction with the accompanying drawings.

DETAILED DESCRIPTION OF THE INVENTION

In order to mitigate the diffusion limitation and facilitate good ohmic contact to the channel of the GaN HFET device, the inventors have thinned down the AlGaN barrier, by reactive ion etching the AlGaN barrier away.

Figure 1:
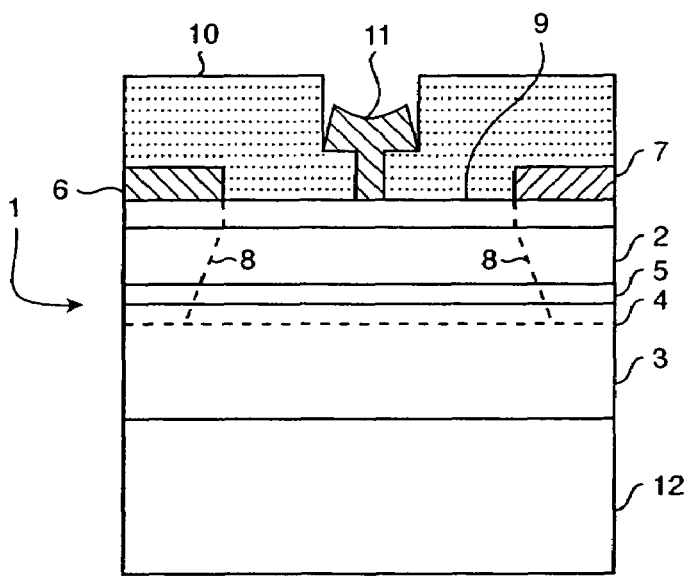
FIG. 1, already described in detail, is a cross sectional view of a prior art GaN FET device.
Figure 2:
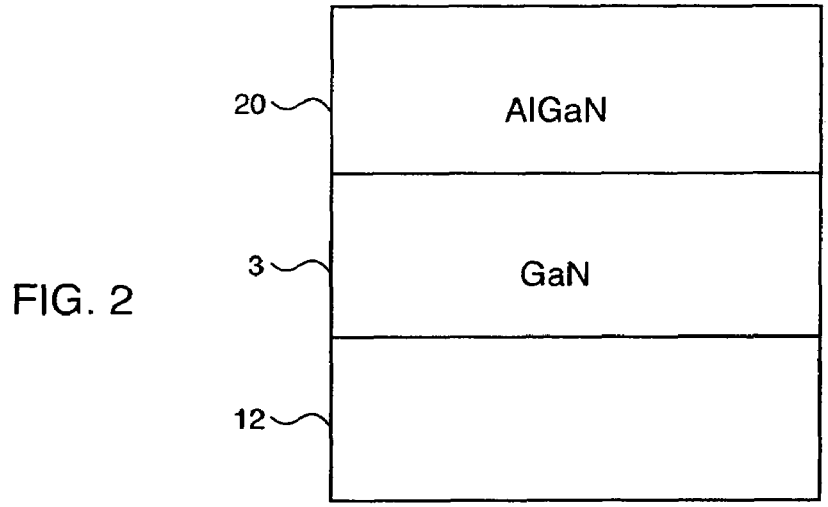
FIG. 2 shows a schematic cross sectional view of a GaN FET device before recess etching.
Figure 3:
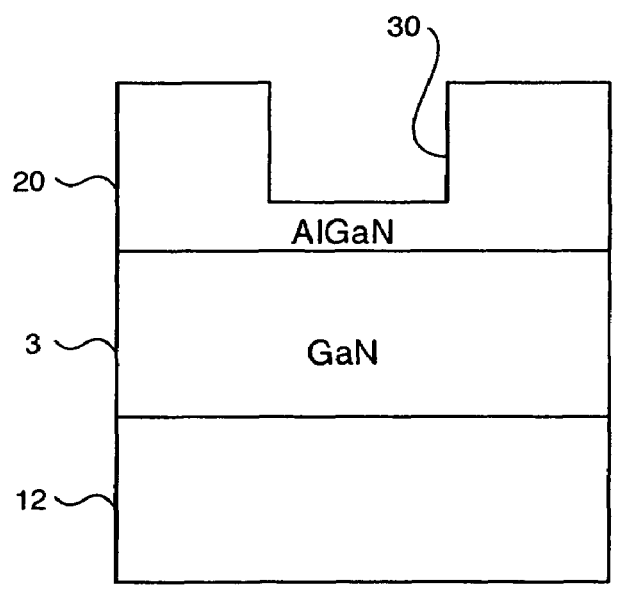
FIG. 3 shows a schematic cross sectional view of the GaN FET device of FIG. 2 after recess etching.

FIG. 2 shows a schematic cross sectional view of the FET before the recess etching, while FIG. 3 shows a cross sectional view of the FET after the recess etching. In both figures, AlGaN layers 2, 5 and 9 of FIG. 1 have been globally indicated with 20. It can be seen from FIG. 3 that a recessed region 30 has been formed, and that the AlGaN layer 20 is thinner in correspondence with the recessed region 30. The recess etching step shown in FIG. 3 is done prior to ohmic metalization. In this way the barrier thickness is reduced only at the location of the contacts. With a thinner barrier, the metals can be alloyed to make a good contact to the GaN channel, thus obtaining the required source/drain ohmic contacts. According to a preferred embodiment of the present invention, the recessed region 30 penetrates about ⅔ of the way into the AlGaN layer 20.

Figure 4:
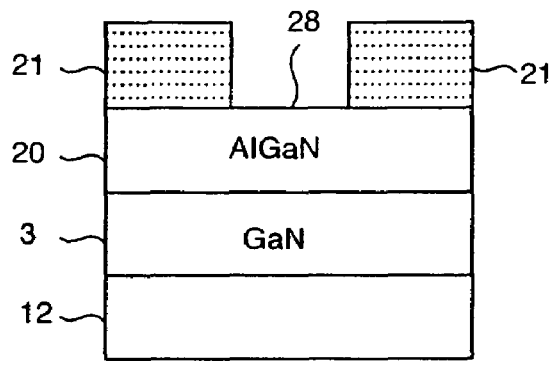
FIG. 4 shows a schematic cross sectional view of a GaN FET device, in which a layer of photoresist is deposited over the AlGaN semiconductor layer, according to a step of the present invention.
Figure 5:
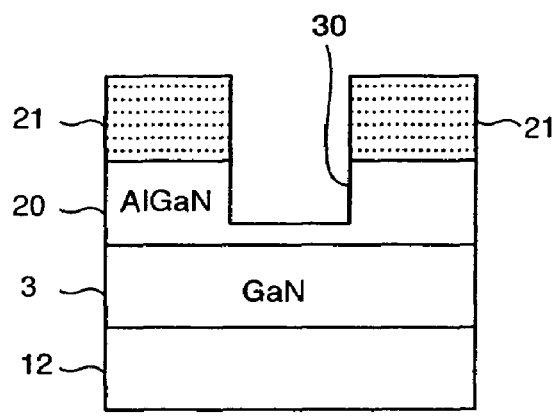
FIG. 5 shows the GaN FET device of FIG. 4, in which recess etching is performed, according to another step of the present invention.

FIGS. 4 to 8 show a preferred embodiment of the present invention, in which the following four steps are performed:

1) Ohmic pattern definition by photolithography (FIG. 4);

2) Ohmic recess etching (FIG. 5);

3) Metalization (FIG. 6); and

Figure 7:
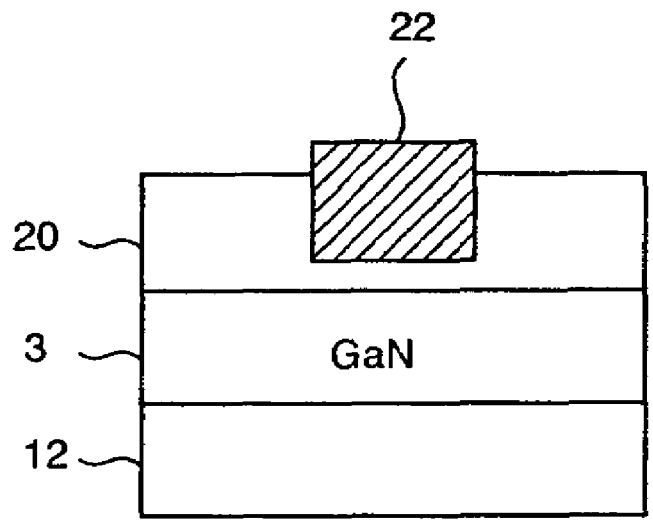
FIG. 7 shows the GaN FET device of FIG. 6, in which the photoresist layer has been removed, according to another step of the present invention.
Figure 8:
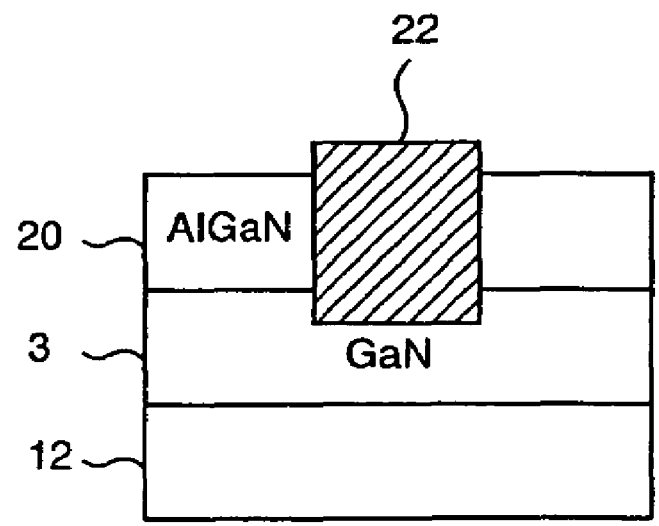
FIG. 8 shows the GaN FET device of FIG. 7, in which an annealing process has been performed, according to a still further step of the present invention.

4) Contacts alloying (FIGS. 7 and 8).

FIG. 4 shows an ohmic pattern definition step, in which regions 21 of photoresist are deposited over the semiconductor layers 20. More specifically, the photoresist is first spinned on, subsequently baked to evaporate excess solvent, then patterned by exposing selected areas to UV light, and finally the exposed resist is developed to open a semiconductor region. In this way, a region 28 is formed, for subsequent recessing and metallizing steps.

FIG. 5 shows the structure of the FET after the ohmic recess etching, in which the recessed region 30 is formed. Preferably, a reactive ion recession etching (RIE) technique employing Chlorine ($Cl_2$) is used, with the following conditions: DC bias=100V; Chamber pressure=5 mT; $Cl_2$ flow rate=10 sccm. More specifically, the patterned wafer comprising a structure like the structure shown in FIG. 4 is loaded in a reactive ion plasma etching machine and areas unprotected by photoresist are etched, thus obtaining the structure of FIG. 5. The use of dry, non-isotropic, RIE is preferred, because the AlGaN layer is resistant to wet chemical etching. Further, the use of chlorine facilitates etching, because it allows uniform etching to be obtained.

Figure 6:
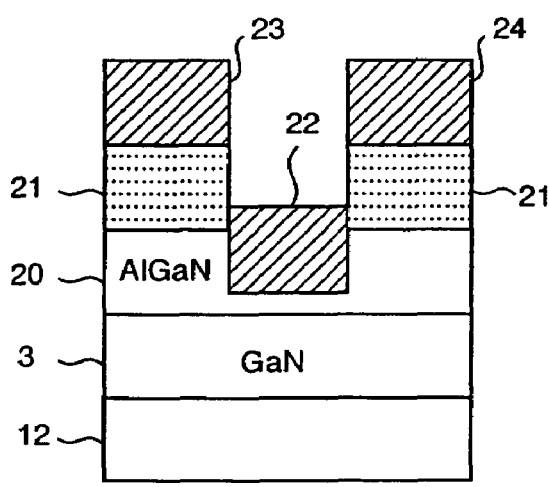
FIG. 6 shows the GaN FET device of FIG. 5, in which ohmic metals are deposited, according to a further step of the present invention.

FIG. 6 shows the structure of the FET after a step in which ohmic metals are deposited. According to the structure shown in FIG. 6, the metals are deposited on regions 22, 23 and 24. More specifically, a patterned wafer comprising a structure like the structure shown in FIG. 5 is loaded into an e-beam evaporator and metal is evaporated over the entire wafer. Only the region 22 will be needed, in order to form the required source/drain contact.

FIG. 7 shows the structure of the FET after a "lift-off" process step. According to this step, the undesired metal regions 23, 24 are lifted off when the resist 21 is removed with conventional solvents. More specifically, the metal regions 23, 24 are lifted off by soaking the wafer comprising a structure like the structure in FIG. 6 in a solvent that dissolves the photoresist regions 21. As a consequence, the metal regions 23, 24 over the photoresist regions 21 peal off the wafer once the resist is de-solved.

FIG. 8 shows the structure of the FET after the heating or annealing step, which is preferably effected at a temperature of 875° C. The region 22 has now penetrated the layered semiconductor structure 3 and communicates with the two-dimensional electron gas described with reference to FIG. 1.

Figure 9:
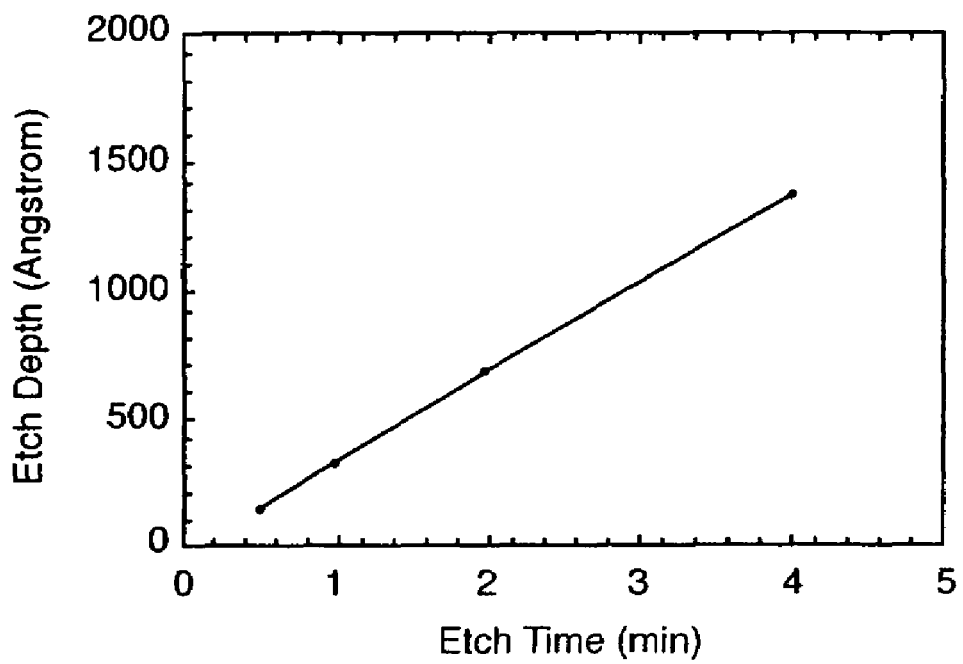
FIG. 9 shows a diagram, in which the etch depth obtained during the etching process is plotted as a function of the etch time.

FIG. 9 shows the etch-rate of the Chlorine ($Cl_2$) in the recess ion etching step performed in order to thin the AlGaN barrier. It can be seen that the etch depth is a linear function of time.

Figure 10:
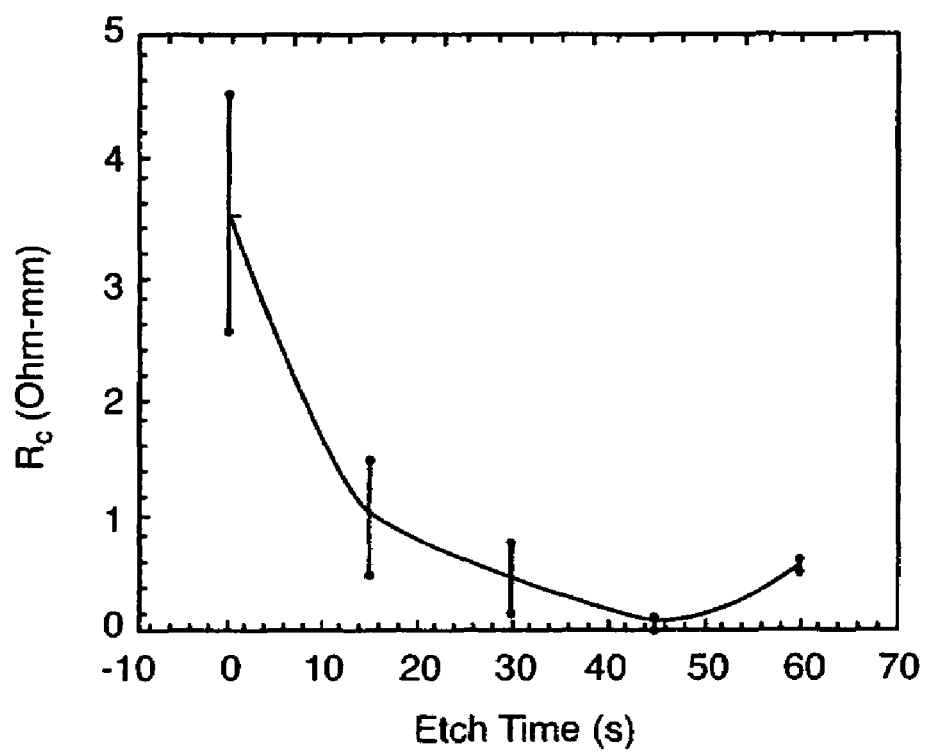
FIG. 10 shows a diagram in which the resistance of the ohmic contact is plotted as a function of the etch time.

FIG. 10 shows the contact resistance $R_c$ of a GaN FET device fabricated according to the present invention, as a function of time. From this figure, it can be seen that the best (lowest) value of the resistance, namely 0.2 Ω/mm, is obtained after an etching time of approximately 45 seconds. When looking for this value in the graph of FIG. 9, an "optimal" etch depth of approximately 200 Angstrom can be noted.

While several illustrative embodiments of the invention have been shown and described, numerous variations and alternative embodiments will occur to those skilled in the art. Such variations and alternative embodiments are contemplated, and can be made without departing from the spirit and scope of the invention as defined in the appended claims.

What is claimed is:

1. In a layered semiconductor structure including
  a) a group III nitride compound first semiconductor layer having a first band gap and doped with a charge carrier; and
  b) a group III nitride compound second semiconductor layer having a second band gap that is less than said first band gap and positioned below said first semiconductor layer to generate an electron gas in said semiconductor structure, the improvement comprising said first semiconductor layer having at least one selectively thinned portion; wherein the selectively thinned portion of the first semiconductor layer comprises a recessed portion and wherein an ohmic contact is deposited in said recessed portion.

2. The structure of claim 1, wherein said ohmic contact is heated to communicate with said electron gas.

3. The structure of claim 1, wherein said first semiconductor layer comprises aluminum gallium nitride (AlGaN) and said second semiconductor layer comprises gallium nitride (GaN).

4. The structure of claim 1, wherein the thinned portion is formed through a reactive ion etching (RIE) process.

5. The structure of claim 4, wherein said reactive ion etching (RIE) process employs chlorine ($Cl_2$).

6. The structure of claim 5, wherein said reactive ion etching process (RIE) thins the first semiconductor layer according to a linear function of time.

7. The structure of claim 6, wherein said reactive ion etching process (RIE) has an etching time of 45 seconds.

8. The structure of claim 7, wherein the layered semiconductor structure forms part of a field-effect transistor.

9. The structure of claim 8, wherein the field-effect transistor is a heterojunction field-effect transistor (HFET).

10. A layered semiconductor structure comprising:
  a) a group III nitride compound first semiconductor layer having a first band gap and doped with a charge carrier;
  b) a group III nitride compound second semiconductor layer having a second band gap that is less than said first band gap and positioned below said first semiconductor layer to generate an electron gas in said semiconductor structure; and
  c) at least one ohmic contact communicating with said electron gas, said ohmic contact being formed by depositing a metal system over a recessed portion of said first semiconductor layer and heating said metal system so that it penetrates the layered semiconductor structure and communicates with said electron gas.

11. The structure of claim 10, wherein the layered semiconductor structure forms part of a field-effect transistor.

12. The field-effect transistor of claim 11, wherein said metal system comprises titanium, aluminum, nickel and gold.

13. The field-effect transistor of claim 12, wherein said metal system comprises 6% titanium, 65% aluminum, 13% nickel and 16% gold.

14. The field-effect transistor of claim 11, said field-effect transistor being a heterojunction field-effect transistor (HFET).

15. The field-effect transistor of claim 11, wherein said ohmic contact is made of a metal system comprising a plurality of metals, and wherein heating of the plurality of metals alloys said ohmic contact.

16. In a layered semiconductor structure including
  a) a group III nitride compound first semiconductor layer having a first band gap and doped with a charge carrier; and
  b) a group III nitride compound second semiconductor layer having a second band gap that is less than said first band gap and positioned below said first semiconductor layer to generate an electron gas in said semiconductor structure, the improvement comprising said first semiconductor layer having at least one selectively thinned portion comprising a recessed portion; wherein an ohmic contact is deposited in said recessed portion and penetrates the recessed portion of the first semiconductor layer to communicate with the electron gas.

* * * * *